(12) United States Patent
Cao et al.

(10) Patent No.: US 12,165,879 B2
(45) Date of Patent: Dec. 10, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Xinman Cao, Hefei (CN); Jun Xia, Hefei (CN); Zhongming Liu, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 422 days.

(21) Appl. No.: 17/509,146

(22) Filed: Oct. 25, 2021

(65) Prior Publication Data

US 2022/0216067 A1   Jul. 7, 2022

Related U.S. Application Data

(63) Continuation of application No. PCT/CN2021/105262, filed on Jul. 8, 2021.

(30) Foreign Application Priority Data

Jan. 6, 2021   (CN) .......................... 202110014071.7

(51) Int. Cl.
  *H01L 21/3213*   (2006.01)
  *H01L 21/02*    (2006.01)
  *H01L 21/768*   (2006.01)

(52) U.S. Cl.
  CPC .. *H01L 21/32139* (2013.01); *H01L 21/02068* (2013.01); *H01L 21/76837* (2013.01); *H01L 21/76843* (2013.01)

(58) Field of Classification Search
  None
  See application file for complete search history.

(56) References Cited

U.S. PATENT DOCUMENTS

| | | | |
|---|---|---|---|
| 7,026,253 B2 | 4/2006 | Lee | |
| 7,482,279 B2 | 1/2009 | Lee | |
| 8,497,142 B2 | 7/2013 | Yang | |
| 9,726,972 B2 | 8/2017 | Shishido et al. | |
| 2004/0127037 A1 | 7/2004 | Lee | |
| 2006/0079093 A1 | 4/2006 | Kim | |

(Continued)

FOREIGN PATENT DOCUMENTS

| | | |
|---|---|---|
| CN | 1512272 A | 7/2004 |
| CN | 1761036 A | 4/2006 |

(Continued)

*Primary Examiner* — Alexander G Ghyka
(74) *Attorney, Agent, or Firm* — Syncoda LLC; Feng Ma

(57) ABSTRACT

A method for manufacturing a semiconductor structure and a semiconductor structure are provided. The method for manufacturing a semiconductor structure includes: forming a conductive layer, a protective layer, and a mask layer in sequence on the substrate, the mask layer including a first pattern facing the first region and a second pattern facing the second region; forming a restriction pattern located in the second region by etching the protective layer using the mask layer as a mask; and forming contact pads located in the first region and connecting wires located in the second region on the conductive layer by etching the conductive layer using the mask layer as a mask.

13 Claims, 20 Drawing Sheets

(56) References Cited

U.S. PATENT DOCUMENTS

2006/0124587 A1 6/2006 Lee
2016/0202603 A1 7/2016 Shishido et al.
2016/0322371 A1* 11/2016 Yonemochi ......... H01L 21/0337

FOREIGN PATENT DOCUMENTS

| CN | 108717936 A | 10/2018 |
| CN | 209045552 U | 6/2019 |
| CN | 112864157 A | 5/2021 |

* cited by examiner

METHOD FOR MANUFACTURING SEMICONDUCTOR STRUCTURE AND SEMICONDUCTOR STRUCTURE

CROSS-REFERENCE TO RELATED APPLICATIONS

The present application is a continuation of International Application No. PCT/CN2021/105262, filed on Jul. 8, 2021, which is based upon and claims priority to Chinese Patent Application No. 202110014071.7, filed on Jan. 6, 2021 in China Patent Office and entitled "Method for Manufacturing Semiconductor Structure and Semiconductor Structure". The contents of International Application No. PCT/CN2021/105262 and Chinese Patent Application No. 202110014071.7 are hereby incorporated by reference in their entireties.

BACKGROUND

With the gradual development of the memory device technology, Dynamic Random Access Memory (DRAM) has gradually been applied to various electronic devices due to the relatively high density and relatively high read/write speed thereof. A DRAM includes multiple duplicate memory cells. The memory cell usually includes a capacitor structure and a transistor structure. The transistor structure is connected with the capacitor structure so as to read data stored in the capacitor structure or write data into the capacitor structure.

In the related art, a substrate includes an array region and an edge region on one side of the array region. However, some connecting wires in the edge region have a relatively small width and may be easily broken in a subsequent process flow.

SUMMARY

Embodiments of the present disclosure relate to the technical field of semiconductor manufacturing, and particularly to a method for manufacturing a semiconductor structure and a semiconductor structure.

An embodiment of the present disclosure provides a method for manufacturing a semiconductor structure. The method includes: providing a substrate, the substrate including a first region and a second region adjacent to the first region; forming a conductive layer, a protective layer, and a mask layer in sequence on the substrate, the mask layer including a first pattern facing the first region and a second pattern facing the second region; forming a restriction pattern located in the second region by etching the protective layer using the mask layer as a mask; and forming contact pads located in the first region and connecting wires located in the second region on the conductive layer by etching the conductive layer using the mask layer as a mask, the restriction pattern being used to restrict an etching range when the conductive layer is etched.

An embodiment of the present disclosure further provides a semiconductor structure. The semiconductor structure includes a substrate and a conductive layer arranged on the substrate. The substrate includes a first region and a second region adjacent to the first region. A protective layer and a mask layer are formed in sequence on the conductive layer after the conductive layer is formed, herein the mask layer includes a first pattern facing the first region and a second pattern facing the second region. A restriction pattern located in the second region is formed on the protective layer by etching the protective layer using the mask layer as a mask; and contact pads located in the first region and connecting wires located in the second region are formed on the conductive layer by etching the conductive layer using the mask layer as a mask, the restriction pattern is used to restrict an etching range when the conductive layer is etched.

BRIEF DESCRIPTION OF THE DRAWINGS

In order to more clearly illustrate the technical schemes of the embodiments of the present disclosure or in related art, the following briefly introduces the accompanying drawings required for describing the embodiments or the related art. It is apparent that the accompanying drawings in the following description show only some embodiments of the present disclosure, and those ordinary skilled in the art may still derive other drawings from these accompanying drawings without involving any inventive efforts.

REFERENCE SIGNS

Figure 1:
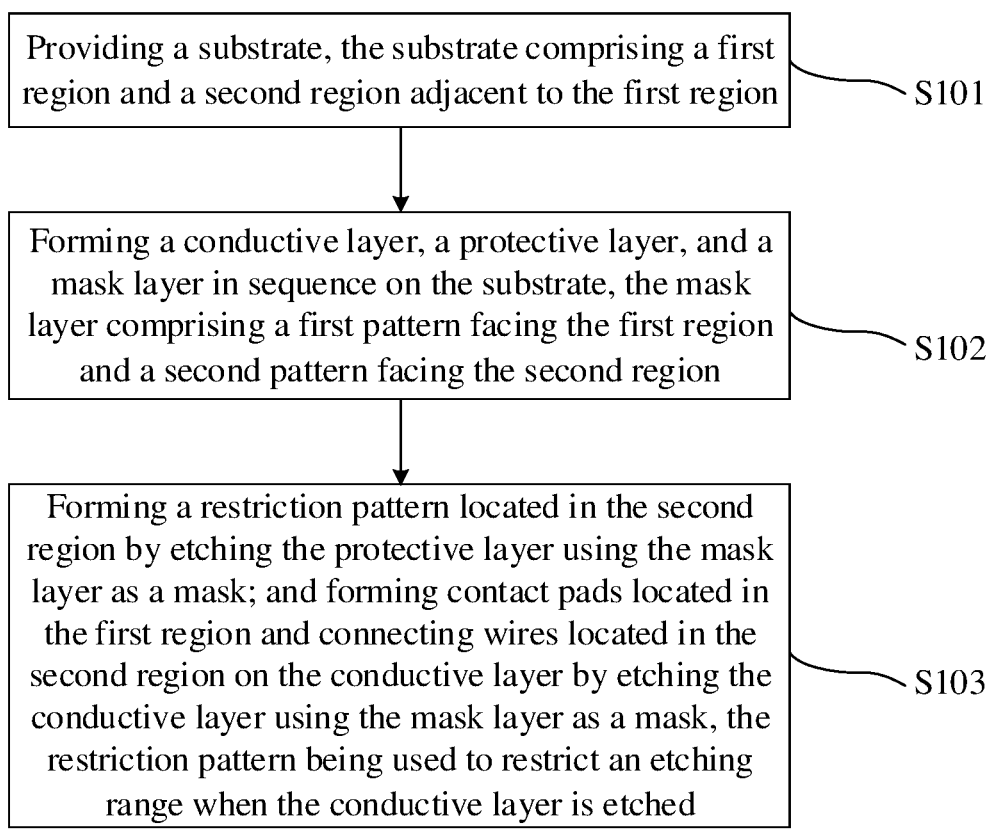
FIG. 1 is a flowchart of a method for manufacturing a semiconductor structure according to an embodiment of the present disclosure.
Figure 2:
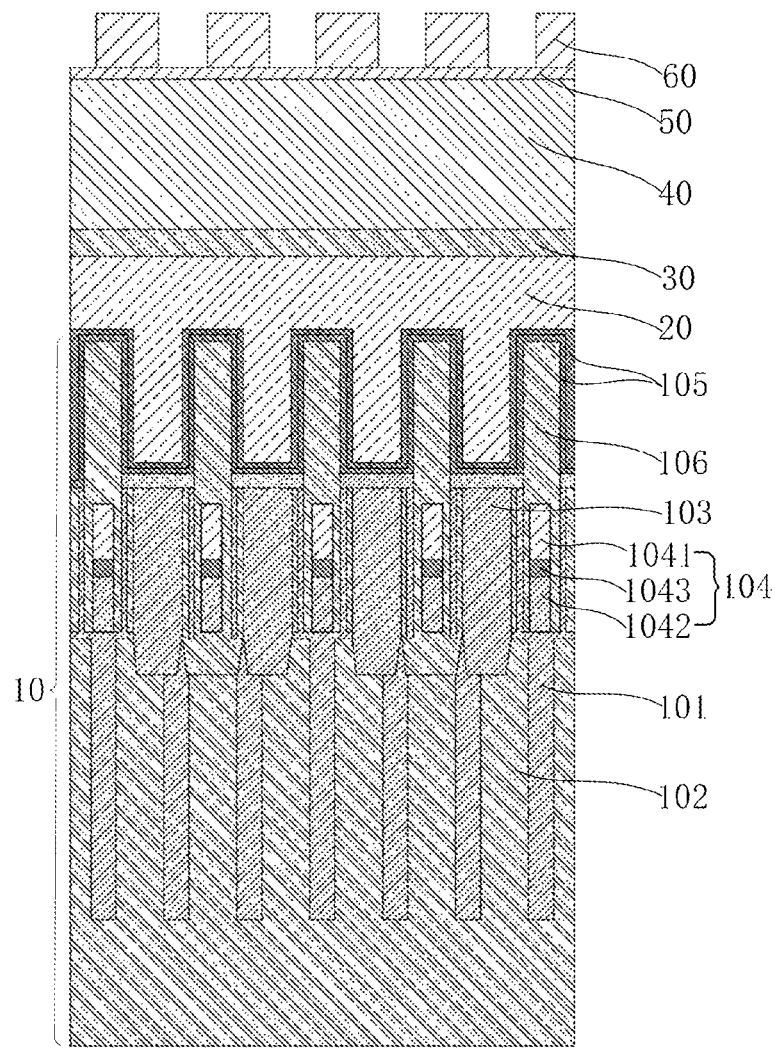
FIG. 2 is a structural schematic diagram of a first region after forming a photoetched layer in a method for manufacturing a semiconductor structure according to an embodiment of the present disclosure.
Figure 3:
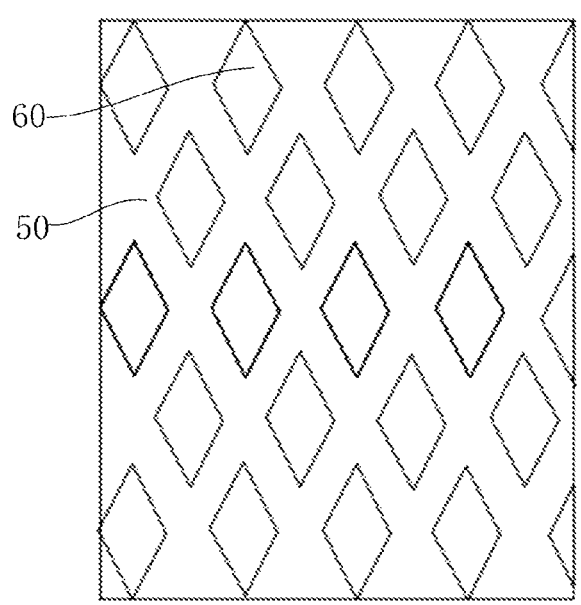
FIG. 3 is a top view of FIG. 2.
Figure 4:
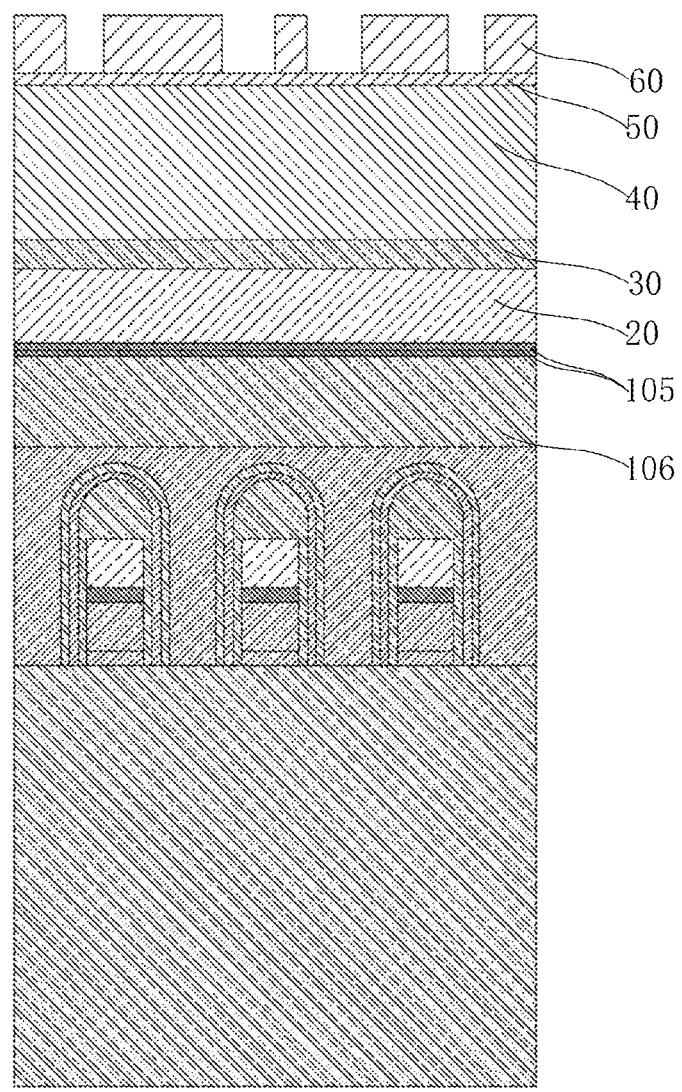
FIG. 4 is a structural schematic diagram of a second region after forming a photoetched layer in a method for manufacturing a semiconductor structure according to an embodiment of the present disclosure.
Figure 5:
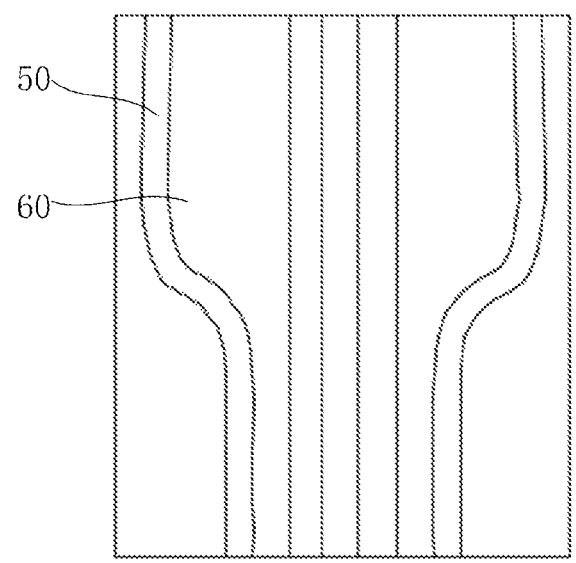
FIG. 5 is a top view of FIG. 4.
Figure 6:
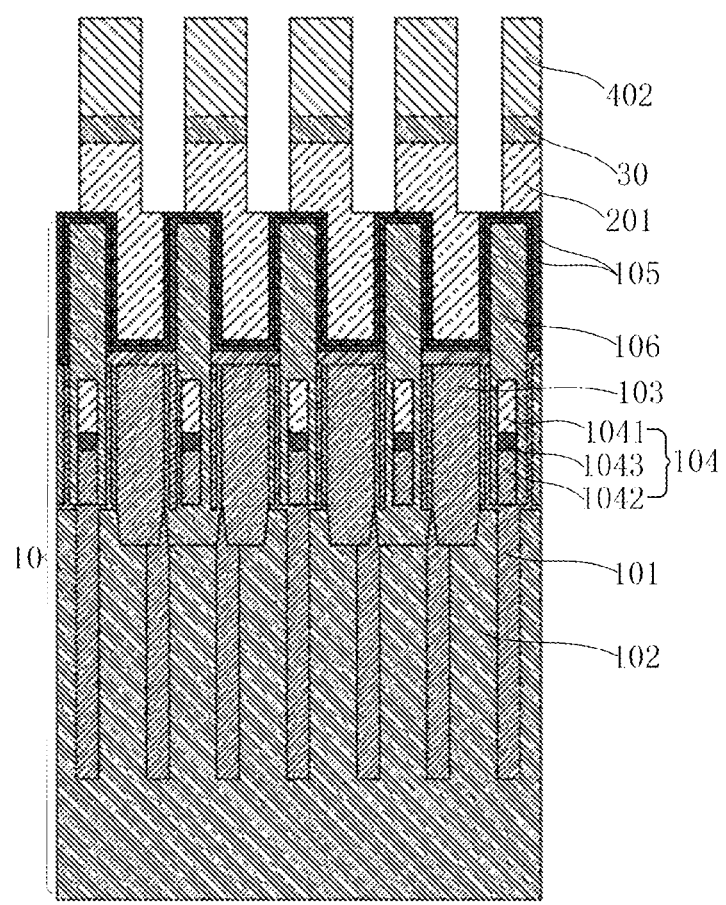
FIG. 6 is a structural schematic diagram of a first region after forming contact pads in a method for manufacturing a semiconductor structure according to an embodiment of the present disclosure.
Figure 7:
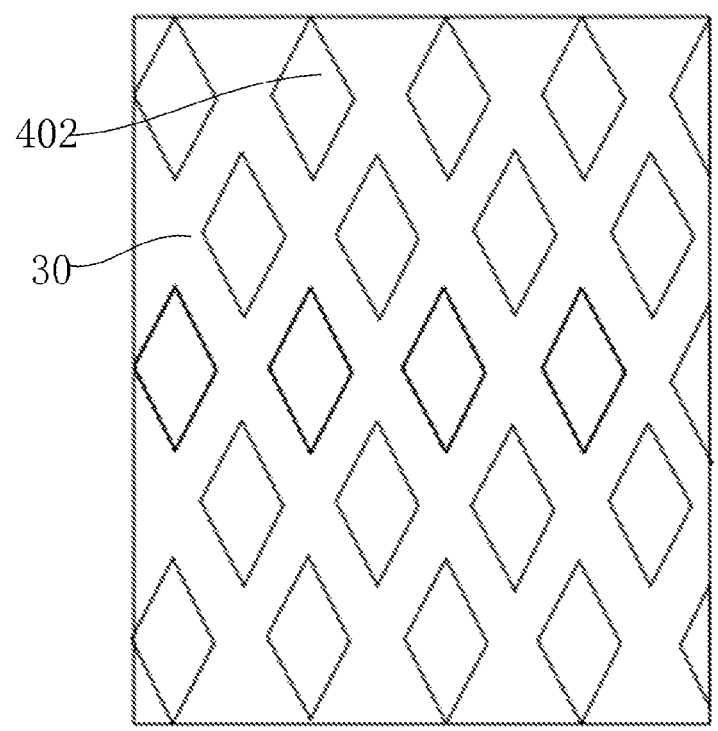
FIG. 7 is a top view of FIG. 6.
Figure 8:
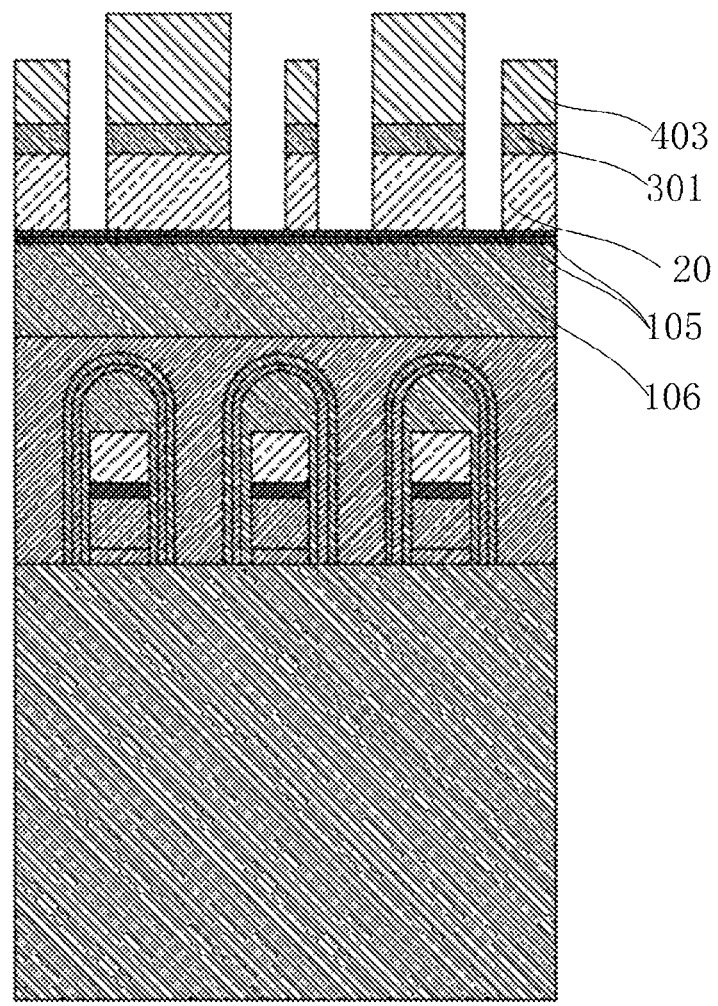
FIG. 8 is a structural schematic diagram of a second region after forming contact pads in a method for manufacturing a semiconductor structure according to an embodiment of the present disclosure.
Figure 9:
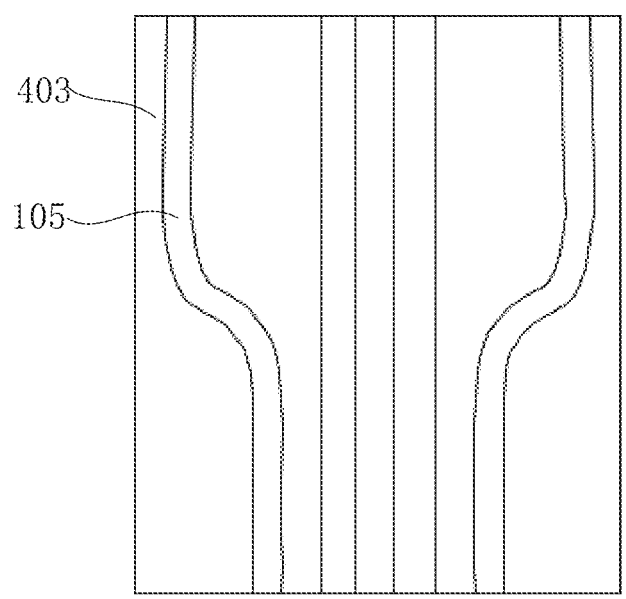
FIG. 9 is a top view of FIG. 8.

10: substrate;
20: conductive layer;
30: protective layer;
40: mask material layer;
50: transfer material layer;
60: photoetched layer;
70: filling layer;
101: shallow trench isolation structure;
102: active region structure;
103: conductive block;
104: bit line structure;
105: conductive barrier layer;
106: insulating layer;
201: contact pad;
202: connecting wire;
203: residue;
301: restriction pattern;
402: first pattern;
403: second pattern;
1041: first bit line structure;
1042: second bit line structure; and
1043: bit line barrier layer.

DETAILED DESCRIPTION

In order to make the purpose, technical solutions, and advantages of the embodiments of the present disclosure clearer, the technical solutions in the embodiments of the present disclosure will be clearly and completely described below in combination with the drawings in the embodiments of the present disclosure. It is apparent that the described embodiments are not all but part of embodiments of the present disclosure. All other embodiments obtained by those of ordinary skilled in the art based on the embodiments of the present disclosure without involving any inventive efforts fall within the scope of protection of the embodiments of the present disclosure.

A DRAM includes multiple duplicate memory cells. The memory cell includes a capacitor structure and a transistor structure. A gate of the transistor structure is connected with a word line. A drain of the transistor structure is connected with a bit line. A source of the transistor structure is connected with the capacitor structure. The voltage signal on the word lines may control the transistors to be turned on or off to further, through the bit lines, read data stored in the capacitor structure or write data into the capacitor structure.

In the related art, the transistor structure is arranged in an array region of a substrate. The substrate further includes an edge region on one side of the array region. A contact layer is arranged on the substrate, and includes the contact pads facing the array region and connecting wires facing the edge region. The contact pads are used to connect the transistor structure and the capacitor structure. The connecting wires have a certain circuit pattern.

During manufacturing, a conductive layer is formed at first on the substrate. Then, a mask layer is formed on the conductive layer. The mask layer is etched to form a first pattern facing the array region and a second pattern facing the edge region. The conductive layer may be etched using the mask layer as a mask to form the contact pads in the array region and the connecting wires in the edge region.

However, the connecting wires in the edge region have a relatively small width. In order to obtain a connecting wire with a relatively small width, it is necessary to set the second pattern of the mask layer with a relatively small width. At that case, it is difficult to control the etching degree when the conductive layer is etched using the mask layer as the mask, which cause that the conductive layer corresponding to the second pattern may be etched excessively, and the connecting wires may be easily broken.

The present embodiment provides a method for manufacturing a semiconductor structure and a semiconductor structure. Since a protective layer is arranged between a conductive layer and a mask layer, part of the protective layer may be removed at first to form a restriction pattern when the conductive layer is etched using the mask layer as a mask. The restriction pattern may control the etching degree of the conductive layer, so as to further avoid excessive etching of the conductive layer and breakage of the connecting wires.

The semiconductor structure is not limited in the present embodiment. References will now be made taking the condition that the semiconductor structure is a DRAM as an example. However, the present embodiment is not limited thereto. The semiconductor structure in the present embodiment may also be other structures.

As illustrated in FIG. 1, the method for manufacturing a semiconductor in the present embodiment includes the step S101.

At S101, a substrate is provided, and the substrate includes a first region and a second region adjacent to the first region.

As illustrated in FIG. 2 to FIG. 5, the substrate 10 may include multiple shallow trench isolation structures 101 arranged in a space. A transistor structure including an active region structure 102 is arranged between adjacent shallow trench isolation structures 101. The material of the shallow trench isolation structure 101 may include oxide such as silicon oxide. The material of the active region structure 102 may include silicon, etc.

The substrate 10 further includes multiple conductive blocks 103 arranged in a space. Each conductive block 103 is in junction with an active region structure 102. Exemplarily, the material of the conductive block 103 may include a conductive material such as polysilicon.

Further, a bit line structure 104 may be arranged between adjacent conductive blocks 103. The bit line structure 104 includes a first bit line structure 1041, bit line barrier layer 1043, and second bit line structure 1042 that are stacked. The second bit line structure 1042 is arranged close to the active region structure 102 and the shallow trench isolation structure 101. The bit line barrier layer 1043 may prevent the mutual permeation of the materials of the first bit line structure 1041 and the second bit line structure 1042. The bit line barrier layer 1043 may further implement the electrical connection between the first bit line structure 1041 and the second bit line structure 1042. Exemplarily, the material of the first bit line structure 1041 may include tungsten, the material of the second bit line structure 1042 may include polysilicon, and the material of the bit line barrier layer 1043 may include titanium nitride.

In the abovementioned implementations, an insulating film layer may be arranged between the conductive block 103 and the bit line structure 104, to implement insulated connection between the conductive block 103 and the bit line structure 104. Exemplarily, the material of the insulating film layer may include silicon nitride and silicon oxide.

In the present embodiment, the first region is adjacent to the second region. Exemplarily, the first region may be an array region, and the second region may correspondingly be an edge region on one side of the array region. The first region may correspond to a capacitor structure to implement storage and read of a data layer.

Referring back to FIG. 1, the method for manufacturing a semiconductor structure in the present embodiment further includes step S102.

At S102, a conductive layer, a protective layer, and a mask layer are formed in sequence on the substrate, the mask layer includes a first pattern facing the first region and a second pattern facing the second region.

Referring to FIG. 2 to FIG. 5, the protective layer 30 is between the conductive layer 20 and the mask layer. The protective layer 30 is in junction with the conductive layer 20 and the mask layer. Exemplarily, the material of the conductive layer 20 may include tungsten, the material of the protective layer 30 may include silicon nitride, and the material of the mask layer may include amorphous carbon.

Referring to FIG. 6 to FIG. 9, in some implementations, formation of the mask layer includes the following operations. A mask material layer 40 is formed. A pattern transfer layer having a first etched pattern is formed on the mask material layer 40. Part of the mask material layer 40 is removed using the pattern transfer layer as a mask to form the mask layer including the first pattern 402 and the second pattern 403.

With such arrangement, the first etched pattern of the pattern transfer layer is transferred to the mask material layer 40 to form the mask layer including the first pattern 402 and the second pattern 403. The dimensional accuracy of the first pattern 402 and the second pattern 403 is improved, and the performance of the semiconductor structure is further improved.

Referring back to FIG. 2 to FIG. 5, further, the operation that a pattern transfer layer having a first etched pattern is formed on the mask material layer 40 includes the following operations. A transfer material layer 50 and a photoetched layer 60 having a second etched pattern are formed in sequence on the mask material layer 40. Part of the transfer material layer 50 is removed using the photoetched layer 60 as a mask to form the pattern transfer layer having the first etched pattern.

With such arrangement, the patterns transferring through the photoetched layer 60 and the pattern transfer layer enable to obtain the mask layer including the first pattern 402 and the second pattern 403. The dimensional accuracy of the first pattern 402 and the second pattern 403 and the performance of the semiconductor structure are further improved.

In the above-mentioned implementation, the material of the pattern transfer layer may include silicon oxynitride. The material of the photoetched layer 60 may include oxide such as silicon oxide.

After the first pattern 402 and the second pattern 403 are formed, the method for manufacturing a semiconductor structure in the present embodiment further includes step S103.

At S103, a restriction pattern located in the second region is formed by etching the protective layer using the mask layer as a mask. The contact pads in the first region and connecting wires in the second region are formed on the conductive layer by etching the conductive layer using the mask layer as a mask. The restriction pattern is used to restrict an etching range when the conductive layer is etched.

Exemplarily, part of the protective layer 30 is removed by etching to form the restriction pattern 301.

The restriction pattern 301 has been formed before etching the conductive layer 20. The restriction pattern 301 may restrict the etching degree of the conductive layer 20 in the second region when the conductive layer 20 is etched, so as to further avoid excessive etching of the conductive layer 20 in the second region and breakage of the connecting wires 202.

Figure 10:
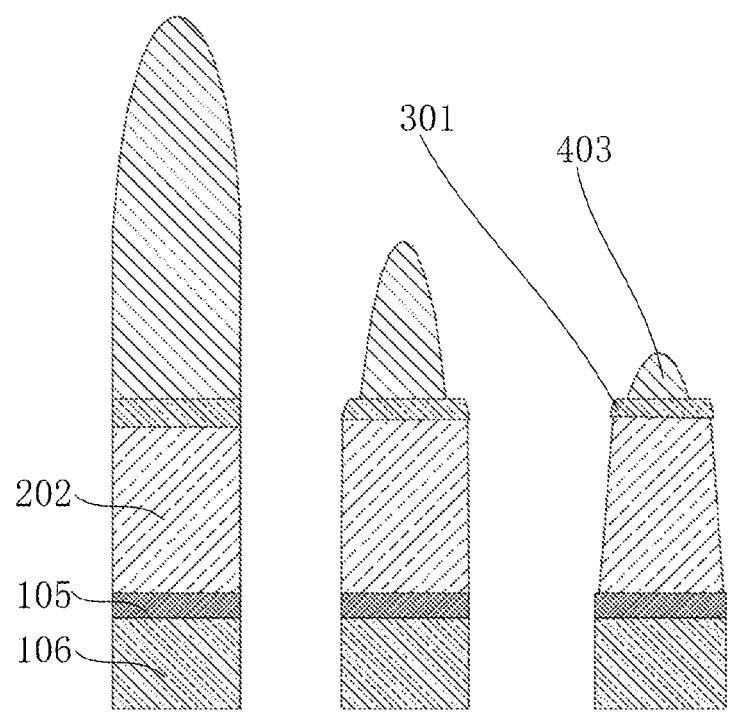
FIG. 10 is a partial schematic diagram after forming connecting wires in a second region in a method for manufacturing a semiconductor structure according to an embodiment of the present disclosure.
Figure 11:
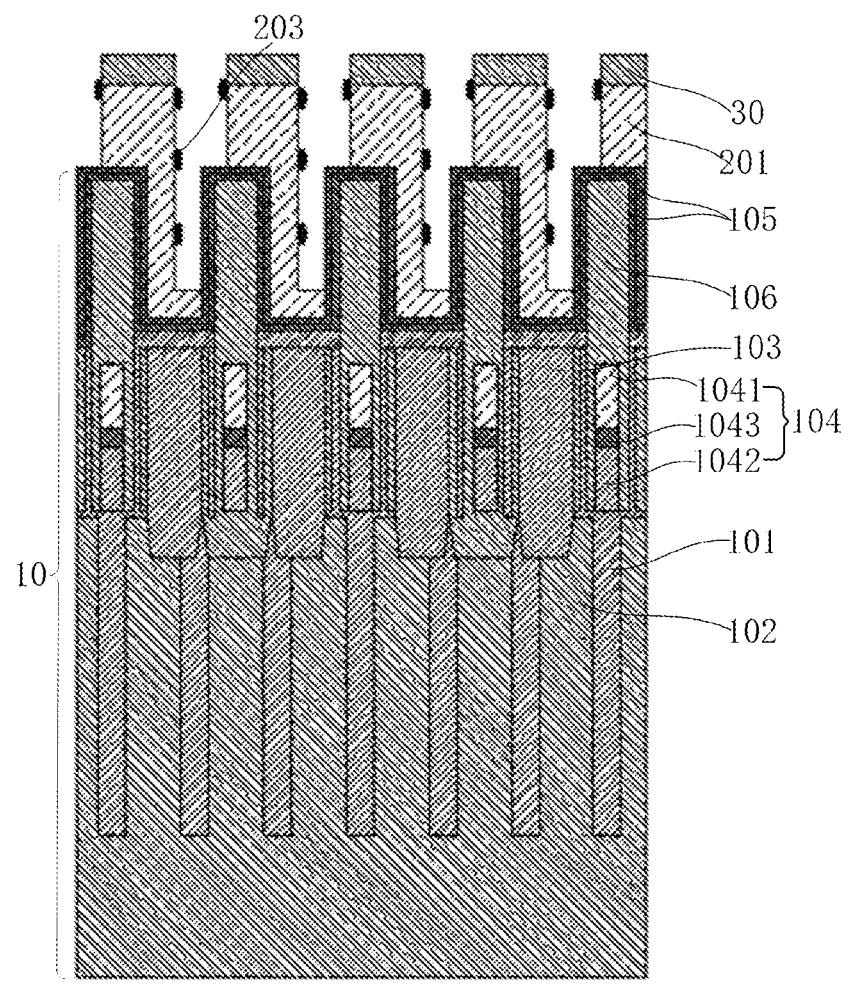
FIG. 11 is a schematic diagram when there are residues on sidewalls of the contact pads in a method for manufacturing a semiconductor structure according to an embodiment of the present disclosure.
Figure 12:
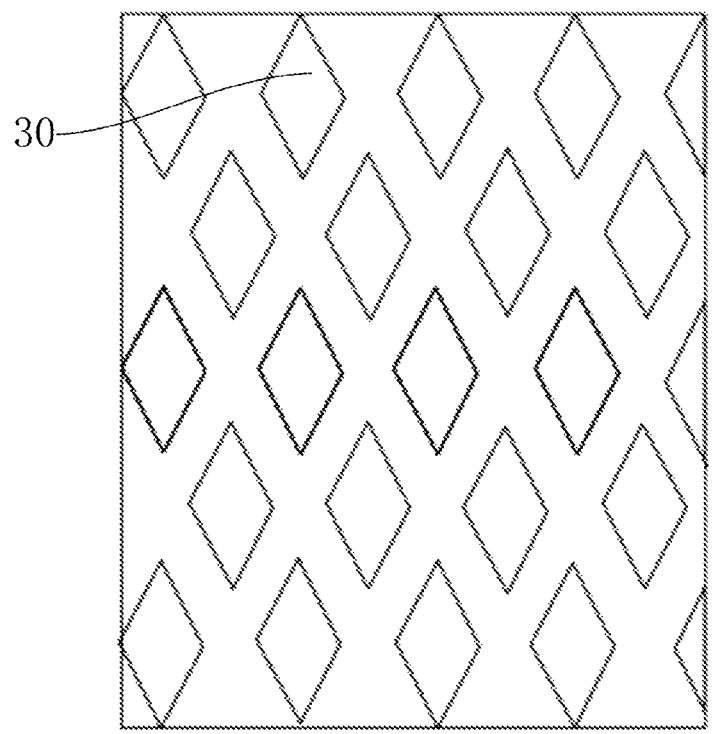
FIG. 12 is a top view of FIG. 11.
Figure 13:
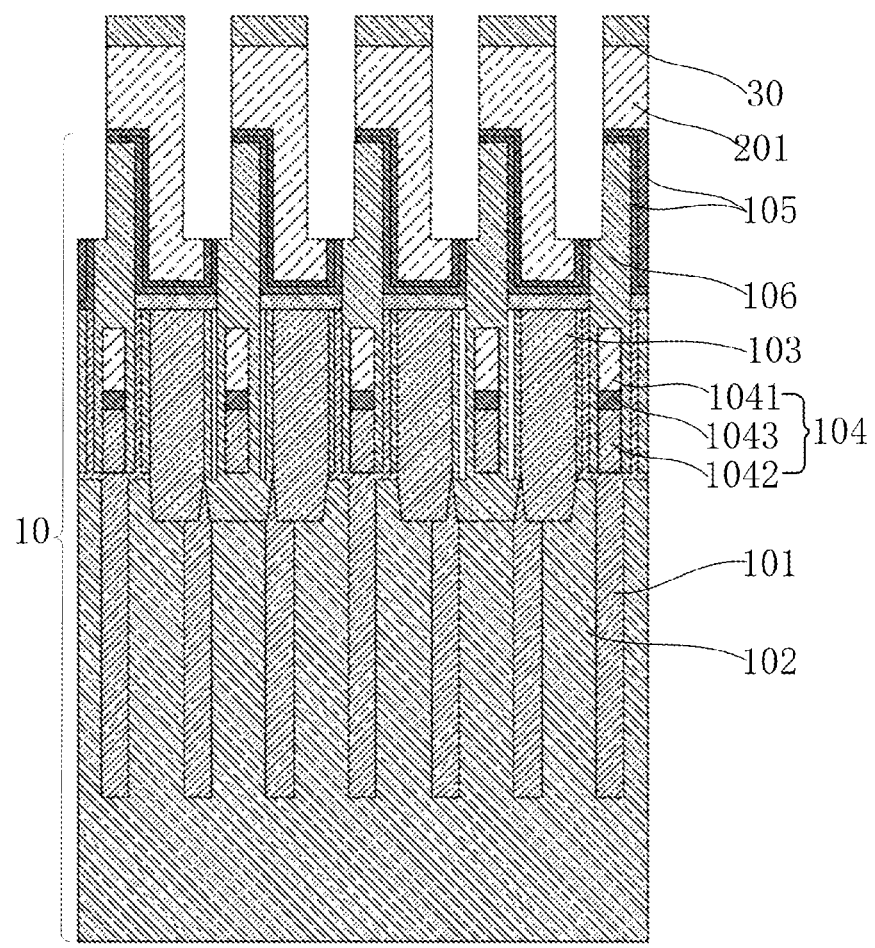
FIG. 13 is a structural schematic diagram of a first region after the sidewalls of the contact pads and connecting wires are processed in a method for manufacturing a semiconductor structure according to an embodiment of the present disclosure.
Figure 14:
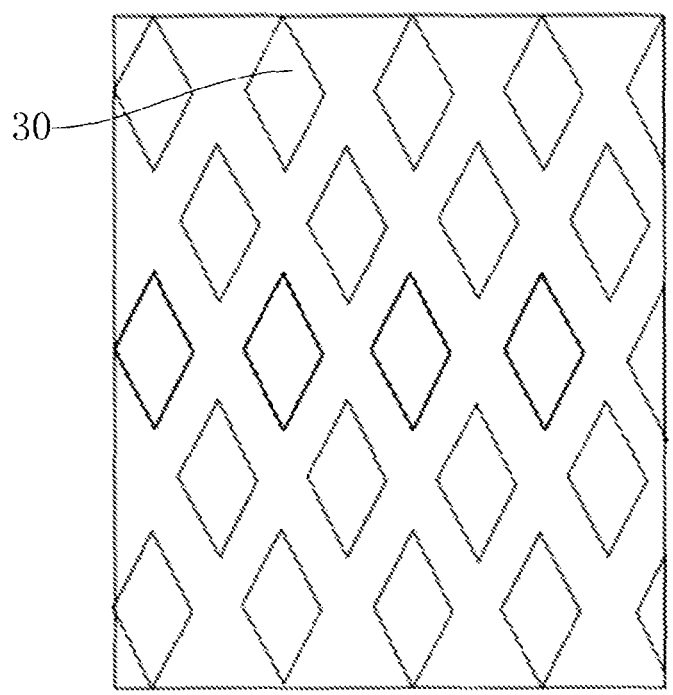
FIG. 14 is a top view of FIG. 13.
Figure 15:
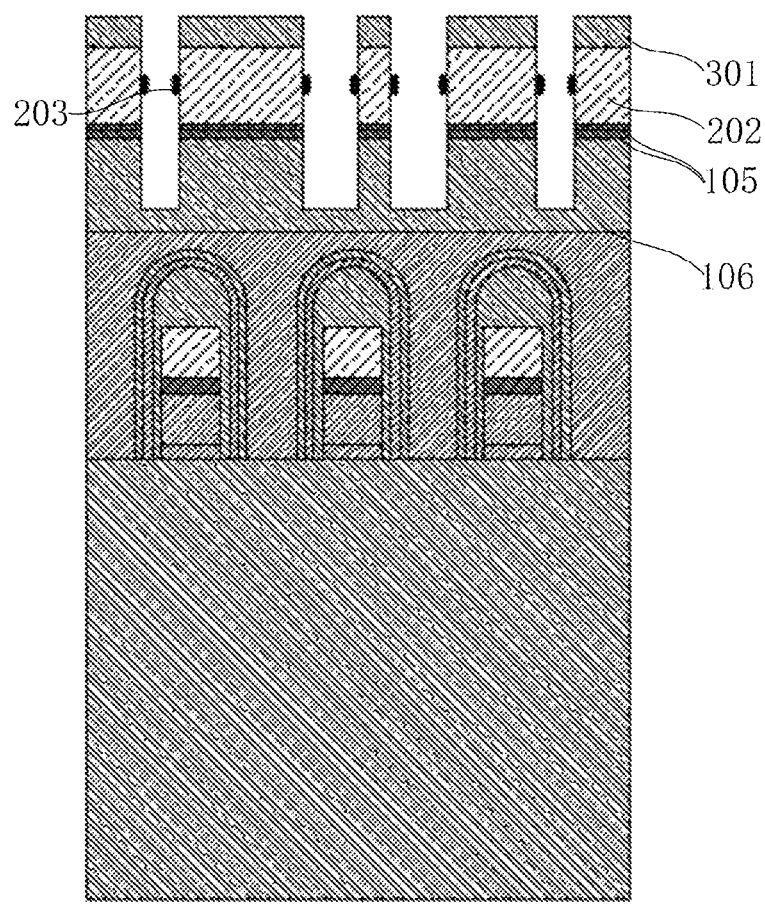
FIG. 15 is a schematic diagram when there are residues on the sidewalls of the connecting wires in a method for manufacturing a semiconductor structure according to an embodiment of the present disclosure.
Figure 16:
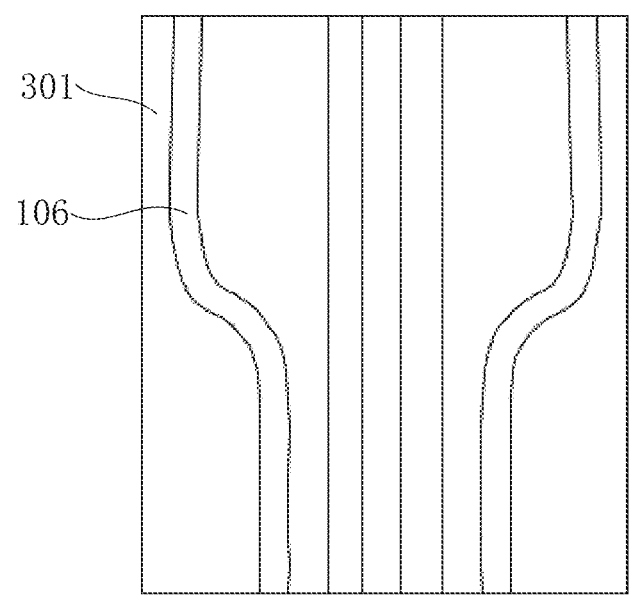
FIG. 16 is a top view of FIG. 15.
Figure 17:
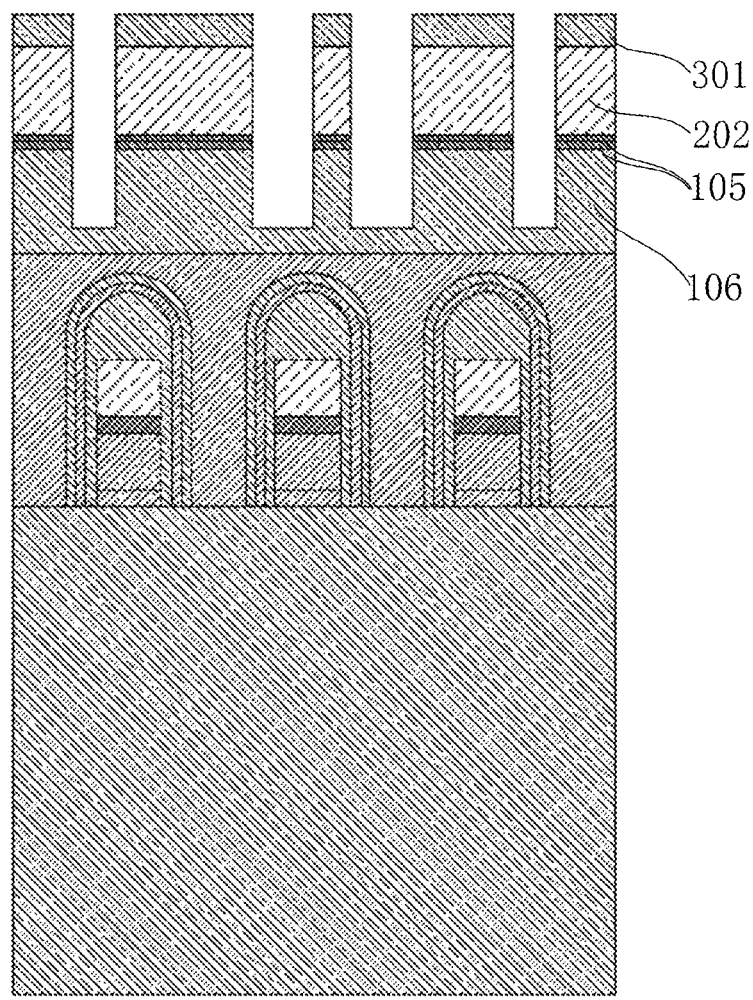
FIG. 17 is a structural schematic diagram of a second region after sidewalls of the contact pads and connecting wires are processed in a method for manufacturing a semiconductor structure according to an embodiment of the present disclosure.
Figure 18:
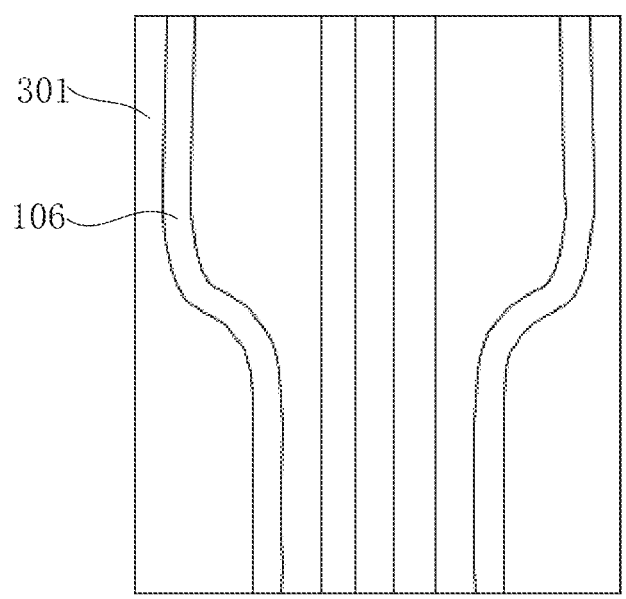
FIG. 18 is a top view of FIG. 17.

As illustrated in FIG. 10, exemplarily, the mask layer (the second pattern 403) corresponding to the connecting wires 202 is etched while the protective layer 30 and the conductive layer 20 are etched, such that the mask layer (the second pattern 403) corresponding to the connecting wires 202 has a small width. Due to the arrangement of the protective layer 30, the width of the restriction pattern 301 is larger than that of the mask layer (the second pattern 403) corresponding to the connecting wires 202, so that the etching degree of the conductive layer 20 corresponding to the restriction pattern 301 is restricted to avoid excessive etching of the conductive layer 20 in the second region.

Further, a restriction pattern 301 can be formed by removing part of the protective layer 30 in the first region while a restriction pattern 301 is formed by removing part of the protective layer 30 in the second region. The restriction pattern 301 in the first region may restrict the etching degree of the conductive layer 20 in the first region, so that the dimensional accuracy of the formed contact pads 201 can be improved, thereby improving the performance of the semiconductor structure.

In the above-mentioned implementations, the protective layer 30 has a lower etching ratio than the mask layer and the conductive layer 20. By such an arrangement, the protective layer 30 is etched relatively slowly during the etching process, so that the etching degree of the conductive layer 20 may further be restricted to further avoid excessive etching of the conductive layer 20.

Further, a projection area of the formed restriction pattern 301 on the substrate 10 may be larger than the projection area of a second pattern 403 on the substrate 10 and the projection area of the connecting wires 202 on the substrate 10. Therefore, the etching degree of the conductive layer 20 is further restricted, and breakage of the connecting wire 202 is further avoided.

According to the method for manufacturing a semiconductor structure in the present embodiment, the substrate 10 includes the first region and the second region adjacent to the first region. The conductive layer 20, the protective layer 30, and the mask layer are formed in sequence on the substrate 10, and the mask layer includes the first pattern 402 facing the first region and the second pattern 403 facing the second region. The restriction pattern 301 located in the second region is formed by etching the protective layer 30 using the mask layer as the mask. The contact pads 201 located in the first region and the connecting wires 202 located in the second region are formed by etching the conductive layer 20 using the mask layer as the mask. Since the protective layer 30 is arranged between the conductive layer 20 and the mask layer, and the restriction pattern 301 located in the second region is formed before forming the connecting wires 202, the restriction pattern 301 may restrict an etching degree of the conductive layer 20 in the second region when the conductive layer 20 in the second region is etched. And then the conductive layer 20 in the second region is excessive etched can be avoided, thereby avoiding the breakage of the formed connecting wires 202.

In some implementations, the specific step of forming the contact pads 201 and the connecting wires 202 may include the following operations. Part of the protective layer 30 is removed by etching the protective layer 30 using the mask layer as the mask at first, and the restriction pattern 301 located in the second region is formed. Then part of the conductive layer 20 is removed by etching the conductive layer 20 using the mask layer as the mask, and the contact pads 201 and the connecting wires 202 are formed.

With such an arrangement, the restriction pattern 301 and the connecting wires 202 are formed through different etching steps, so that the etching degree in each etching step may be controlled accurately to improve the dimensional accuracy of the connecting wires 202, thereby improving the performance of the semiconductor structure.

In other implementations, the specific step of forming the contact pads 201 and the connecting wires 202 may also include: forming the contact pads 201 and the connecting wires 202 while forming the restriction pattern 301 by simultaneously etching the protective layer 30 and the conductive layer 20 using the mask layer as a mask.

With such an arrangements, the restriction pattern 301 and the connecting wires 202 are formed through the same etching step, so that difficulties in manufacturing of the semiconductor structure are reduced.

In the implementation of etching the protective layer 30 and the conductive layer 20 in the same etching step, the protective layer 30 and the conductive layer 20 are etched under the same first etching condition but different second etching conditions. The first etching condition may be an etching source in the etching process, e.g., an etching gas. The second etching condition may be the flow of the etching gas, or etching energy, etc., in the etching process.

Exemplarily, in the same etching step, the protective layer 30 is etched using the same gas, after forming the restriction pattern 301 by etching the protective layer 30, the protective layer 30 is continued to be etched downwards with the same gas to etch the conductive layer 20 to form the contact pads 201 and the connecting wires 202. Corresponding gas flows and/or energy may be different when the protective layer 30 and the conductive layer 20 are etched, so that the dimensional accuracy of the obtained contact pads 201 and connecting wires 202 may be improved, thereby improving the performance of the semiconductor structure.

In the present embodiment, a thickness ratio of the protective layer 30 and the conductive layer 20 in a direction perpendicular to the substrate 10 is not greater than 1:5. Therefore, the protective layer 30 is thick enough, and the protection effect over the conductive layer 20 in a subsequent etching process of the conductive layer 20 may be improved.

In another embodiment, the thickness ratio of the protective layer 30 and the conductive layer 20 may also be 1:6, 1:7, etc., not limited to 1:5.

Referring to FIG. 11 to FIG. 18, after the contact pads 201 and the connecting wires 202 are formed, the method for manufacturing a semiconductor structure in the present embodiment further includes: removing residues on sidewalls of the contact pads 201 and the connecting wires 202 by processing the sidewalls of the contact pads 201 and the connecting wires 202. Exemplarily, the residues 203 on the sidewalls of the contact pads 201 and the connecting wires 202 may be removed by dry etching or wet etching. In order to remove all the residues 203, part of the sidewalls of the contact pads 201 and the connecting wires 202 may be removed together.

Taking that the conductive layer 20 is metal tungsten as an example, an ashing process is needed to remove the mask layer after the process of forming the contact pads 201 by etching. A halogen-containing byproduct generated by etching reacts with tungsten at a high temperature to form a halide of tungsten. The halogen-containing byproduct is relatively volatile, and the halide of tungsten becomes nonvolatile soon because of the decrease of the halogen content thereof, then a shell-like coating, i.e., the residue 203, is formed.

According to the method for manufacturing a semiconductor structure in the present embodiment, the protective layer 30 is formed between the conductive layer 20 and the mask layer. Since the conductive layer 20 covers top ends of the contact pads 201 and the connecting wires 202 away from the substrate 10, formation of the residue 203 at the top ends of the contact pads 201 and the connecting wires 202 is avoided during the process of removing the mask layer, connecting resistance between the contact pads 201 and the capacitor structure is reduced, and the performance of the semiconductor structure is further improved.

Figure 19:
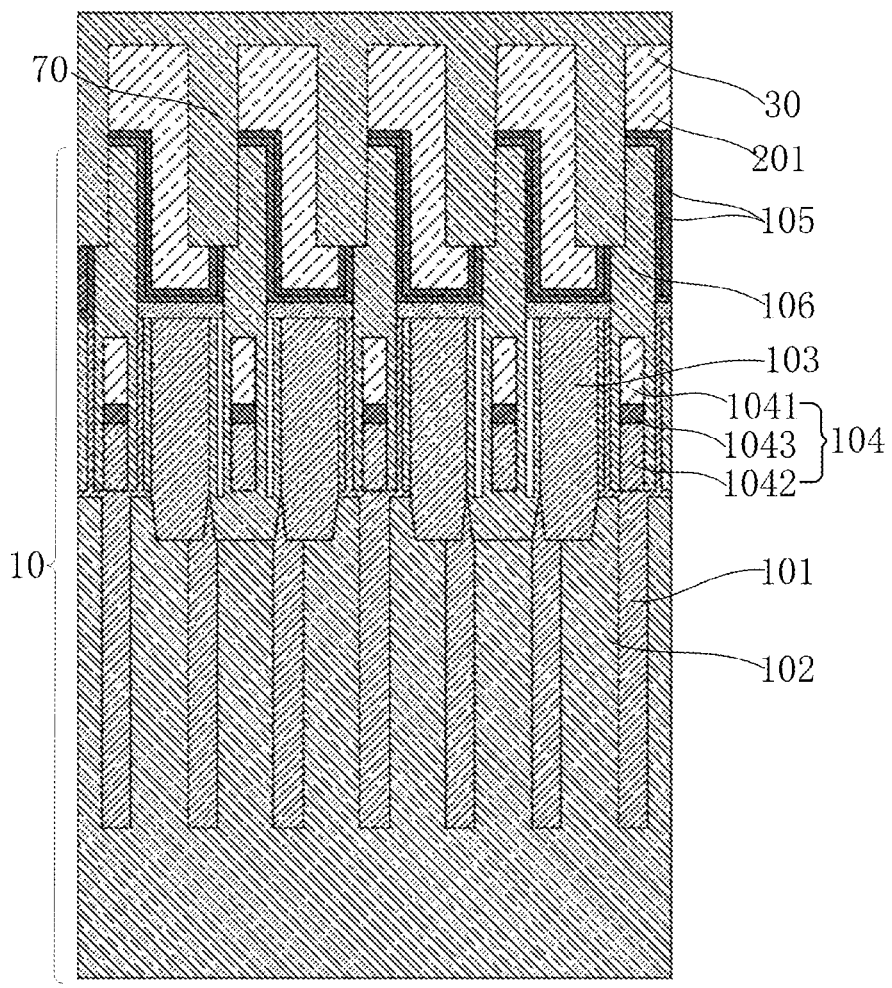
FIG. 19 is a structural schematic diagram of a first region after forming a filling layer in a method for manufacturing a semiconductor structure according to an embodiment of the present disclosure.
Figure 20:
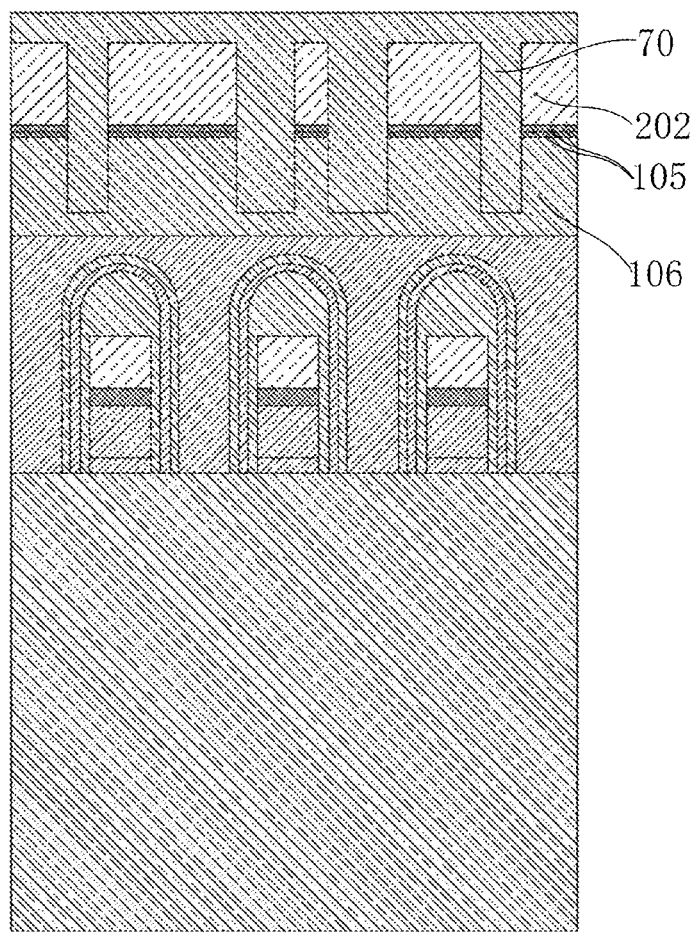
FIG. 20 is a structural schematic diagram of a second region after forming a filling layer in a method for manufacturing a semiconductor structure according to an embodiment of the present disclosure.

Referring to FIG. 19 and FIG. 20, after the residues 203 on the sidewalls of the contact pads 201 and the connecting wires 202 are removed, the method further includes: forming filling layer 70, herein the filling layer 70 is filled between adjacent contact pads 201 and between adjacent connecting wires 202. With such arrangement, the filling layer 70 may support the contact pads 201 and the connecting wires 202 to avoid the contact pads 201 and the connecting wires 202 being bent.

Exemplarily, the material of the filling layer 70 may be the same as that of the protective layer 30, so that the filling layer 70 and the protective layer 30 may form an integrated structure after the filling layer 70 is formed, and to improve the strength of the filling layer 70 and the protective layer 30. For example, the materials of the filling layer 70 and the protective layer 30 may both be silicon nitride. Of course, in another implementation, the material of the filling layer 70 may be different from that of the protective layer 30. No limits are made thereto in the present embodiment, as long as the filling layer 70 is formed of an insulating material.

Referring back to FIG. 10, in the abovementioned implementations, a projection area of the restriction pattern 301 on the substrate 10 is larger than the projection area of the corresponding connecting wires 202 after the contact pads 201 and the connecting wires 202 are formed. Taking the direction illustrated in FIG. 10 as an example, a width of the restriction pattern 301 in a horizontal direction is larger than the width of the connecting wire 202 in the horizontal direction. With such arrangement, the thickness of the removed sidewall of the connecting wires 202 may be restricted when the sidewalls of the connecting wires 202 are processed to remove the residues 203, so as to avoid the sidewalls of the connecting wires 202 being removed by an excessively large thickness when the residues 203 on the sidewall of the connecting wires 202 are removed, thereby further avoid breakage of the connecting wires 202.

Referring back to FIG. 2 to FIG. 5, before forming the conductive layer 20, the method for manufacturing a semiconductor structure in the present embodiment further includes: forming an insulating layer 106 on the substrate 10, herein the insulating layer 106 covers the first region and the second region; forming multiple contact holes on the insulating layer 106 corresponding to the first region. Each contact hole faces an active region structure 102 on the substrate 10.

A conductive material is formed on the insulating layer 106 while the conductive layer 20 is formed. The conductive material is filled in the contact holes, and further covers a side of the insulating layer 106 away from the substrate 10 in the first region and the second region. The capacitor structure is connected with the active region structure 102 through the contact pads 201 and the conductive material in the contact holes. Exemplarily, the conductive material in the contact holes may be connected with the conductive blocks 103 such that the capacitor structure may be connected with the active region structure 102 through the contact pads 201, the conductive material in the contact holes, and the conductive blocks 103.

Further, after the contact holes are formed, the method further includes: forming a conductive barrier layer 105 covering sidewalls and bottoms of the contact holes and the side of the insulating layer 106 away from the substrate 10 on the insulating layer 106. With such an arrangement, the conductive barrier layer may prevent the mutual permeation of the conductive layer 20 and a film layer on the side of the conductive barrier layer 105 away from the conductive layer 20 based on the implementation of the electrical connection between the contact pads 201 and the active region structures 102, so as to improve the performance of the semiconductor structure. In the implementation of connecting the conductive layer 20 with the active region structures 102 through the conductive blocks 103, the conductive barrier layer 105 may prevent the mutual permeation between the conductive blocks 103 and the conductive layer 20.

In the above-mentioned implementation, the conductive barrier layer 105 includes a titanium layer and titanium nitride layer that are stacked, and the titanium nitride layer is arranged away from the substrate 10. Of course, in another implementation mode, the conductive barrier layer 105 may also be formed of another material, as long as the mutual permeation between the conductive layer 20 and the film layer on the side of the conductive barrier layer 105 away from the conductive layer 20 may be prevented while implementing the electrical connection between the contact pads 201 and the active region structure 102.

Referring back to FIG. 1 to FIG. 20, the present embodiment further provides a semiconductor structure. The semiconductor structure includes a substrate 10 and a conductive layer 20 arranged on the substrate 10. The substrate 10 includes a first region and a second region adjacent to the first region. A protective layer 30 and a mask layer are formed in sequence on the conductive layer 20 after the conductive layer 20 is formed, and the mask layer includes a first pattern 402 facing the first region and a second pattern 403 facing the second region. A restriction pattern 301 located in the second region is formed on the protective layer 30 by etching the protective layer 30 using the mask layer as a mask. The contact pads 201 located in the first region and the connecting wires 202 located in the second region are formed on the conductive layer 20 by etching the conductive layer 20 using the mask layer as a mask. The restriction pattern 301 is used to restrict an etching range when the conductive layer 20 is etched.

The semiconductor structure is not limited in the present embodiment. Introductions will now be made taking the condition that the semiconductor structure is a DRAM as an example. However, the present embodiment is not limited thereto. The semiconductor structure in the present embodiment may also be another structure.

According to the semiconductor structure provided in the present embodiment, the substrate 10 includes the first region and the second region facing the first region. The conductive layer 20, the protective layer 30, and the mask layer are formed on the substrate 10 in sequence, and the mask layer includes the first pattern 402 facing the first region and the second pattern 403 facing the second region. The protective layer 30 is etched using the mask layer as the mask to form the restriction pattern 301 in the second region. The conductive layer 20 is etched using the mask layer as the mask to form the contact pads 201 in the first region and the connecting wires 202 in the second region. Since the protective layer 30 is arranged between the conductive layer 20 and the mask layer, and the restriction pattern 301 is formed before forming the connecting wires 202, the restriction pattern 301 may restrict an etching degree of the conductive layer 20 in the second region when the conductive layer 20 in the second region is etched, so as to further avoid excessive etching of the conductive layer in the second region and breakage of the formed connecting wire 202.

Finally, it should be understood that the foregoing embodiments are merely intended for describing the technical solutions of the present disclosure, but not for limiting the present disclosure. Although the present disclosure is described in detail with reference to the foregoing embodiments, those ordinary skilled in the art should understand that they may still make modifications to the technical solutions described in the foregoing embodiments or make equivalent replacements to some or all technical features thereof, without making the essence of the corresponding technical solutions departing from the scope of the technical solutions of the embodiments of the present disclosure.

The invention claimed is:

1. A method for manufacturing a semiconductor structure, comprising:
   providing a substrate, the substrate comprising a first region and a second region adjacent to the first region;
   forming a conductive layer, a protective layer, and a mask layer in sequence on the substrate, the mask layer comprising a first pattern facing the first region and a second pattern facing the second region;
   forming a restriction pattern located in the second region by etching the protective layer using the mask layer as a mask; and
   forming contact pads located in the first region and connecting wires located in the second region from the conductive layer by etching the conductive layer using the mask layer as a mask, the restriction pattern being used to restrict an etching range when the conductive layer is etched;
   wherein before forming the conductive layer, the method further comprises:
   forming an insulating layer on the substrate, the insulating layer covering the first region and the second region; and forming multiple contact holes on the insulating layer corresponding to the first region; and
   wherein forming the conductive layer comprises: forming a conductive material on the insulating layer, the conductive material being filled in the contact holes and further covering a side of the insulating layer away from the substrate in the first region and the second region.

2. The method for manufacturing the semiconductor structure of claim 1, wherein forming the contact pads and the connecting wires comprises:

forming the restriction pattern located in the second region by etching the protective layer using the mask layer as the mask at first; and then forming the contact pads and the connecting wires by etching the conductive layer using the mask layer as the mask.

3. The method for manufacturing the semiconductor structure of claim 1, wherein forming the contact pads and the connecting wires comprises:

forming the contact pads and the connecting wires while forming the restriction pattern by etching the protective layer and the conductive layer using the mask layer as a mask.

4. The method for manufacturing the semiconductor structure of claim 3, wherein a thickness ratio of the protective layer and the conductive layer in a direction perpendicular to the substrate is not greater than 1:5.

5. The method for manufacturing the semiconductor structure of claim 1, wherein after forming the contact pads and the connecting wires, the method further comprises:

removing residues on sidewalls of the contact pads and the connecting wires by processing the sidewalls of the contact pads and the connecting wires.

6. The method for manufacturing the semiconductor structure of claim 5, wherein after forming the contact pads and the connecting wires, a projection area of the restriction pattern on the substrate is larger than a projection area of corresponding connecting wires on the substrate.

7. The method for manufacturing the semiconductor structure of claim 3, wherein after removing the residues on the sidewalls of the contact pads and the connecting wires, the method further comprises:

forming a filling layer, the filling layer being filled between adjacent contact pads and between adjacent connecting wires.

8. The method for manufacturing the semiconductor structure of claim 7, wherein the filling layer has a same material as the protective layer.

9. The method for manufacturing the semiconductor structure of claim 1, wherein an etching ratio of the protective layer is lower than an etching ratio of the mask layer and the conductive layer.

10. The method for manufacturing the semiconductor structure of claim 1, wherein after forming the contact holes, the method further comprises:

forming a conductive barrier layer covering sidewalls and bottoms of the contact holes and covering the side of the insulating layer away from the substrate on the insulating layer.

11. The method for manufacturing the semiconductor structure of claim 10, wherein the conductive barrier layer comprises a titanium layer and titanium nitride layer that are stacked, the titanium nitride layer being disposed away from the substrate.

12. The method for manufacturing the semiconductor structure of claim 1, wherein forming the mask layer comprises:

forming a mask material layer; forming a pattern transfer layer on the mask material layer, the pattern transfer layer having a first etched pattern; and forming the mask layer comprising the first pattern and the second pattern by removing part of the mask material layer using the pattern transfer layer as a mask.

13. The method for manufacturing the semiconductor structure of claim 12, wherein forming the pattern transfer layer on the mask material layer, the pattern transfer layer having the first etched pattern comprises:

forming a transfer material layer and a photoetched layer in sequence on the mask material layer, the photoetched layer having a second etched pattern; and forming the pattern transfer layer having the first etched pattern by removing part of the transfer material layer using the photoetched layer as a mask.

* * * * *